(12) United States Patent
Hackler et al.

(10) Patent No.: US 8,573,120 B1
(45) Date of Patent: Nov. 5, 2013

(54) APPARATUS FOR THERMAL DEVELOPMENT WITH SUPPORTING SURFACE FOR A DEVELOPMENT MEDIUM

(71) Applicant: E.I. du Pont de Nemours and Company, Wilmington, DE (US)

(72) Inventors: Mark A Hackler, Ocean, NJ (US); Anandkumar R Kannurpatti, Glen Mills, PA (US); Robert A McMillen, Downingtown, PA (US); Todd M Scheske, Rochester, NY (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/897,505

(22) Filed: May 20, 2013

Related U.S. Application Data

(62) Division of application No. 12/618,175, filed on Nov. 13, 2009, now Pat. No. 8,468,941, which is a division of application No. 11/193,224, filed on Jul. 29, 2005, now abandoned.

(60) Provisional application No. 60/598,560, filed on Aug. 3, 2004.

(51) Int. Cl.
*G03F 7/34* (2006.01)

(52) U.S. Cl.
USPC .................. 101/401.1; 101/375; 430/306

(58) Field of Classification Search
None
See application file for complete search history.

(56) References Cited

U.S. PATENT DOCUMENTS

| | | | |
|---|---|---|---|
| 3,060,026 A | 10/1962 | Heiart | |
| 3,081,191 A | 3/1963 | Smith et al. | |
| 4,757,763 A * | 7/1988 | MacPhee et al. | 101/425 |
| 5,164,744 A | 11/1992 | Yoshida et al. | |
| 5,279,697 A | 1/1994 | Peterson et al. | |
| 6,797,454 B1 | 9/2004 | Johnson et al. | |

FOREIGN PATENT DOCUMENTS

| | | |
|---|---|---|
| JP | 11095600 A | 4/1999 |
| WO | WO 01/18604 A2 | 3/2001 |
| WO | WO 2007/012023 A2 | 1/2007 |

* cited by examiner

*Primary Examiner* — Joshua D Zimmerman

(57) ABSTRACT

This invention relates to a method and apparatus for thermally developing a photosensitive element. The thermal development method includes heating the photosensitive element to a temperature sufficient to cause a portion of a composition layer in the element to liquefy, soften, or melt; supporting a development medium with a non-rotating surface to provide contact of the development medium with the heated photosensitive element; and providing relative movement between the development medium and the non-rotating surface.

24 Claims, 2 Drawing Sheets

APPARATUS FOR THERMAL DEVELOPMENT WITH SUPPORTING SURFACE FOR A DEVELOPMENT MEDIUM

BACKGROUND OF THE INVENTION

1. Field of the Invention

This invention pertains to a method and apparatus for thermally developing a photosensitive element, and particularly to a method and apparatus for supporting a development medium with a non-rotating surface to provide contact with the photosensitive element.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. Nos. 3,060,023 (Burg et al.); 3,264,103 (Cohen et al.); 5,015,556 (Martens); 5,175,072 (Martens); 5,215,859 (Martens); and 5,279,697 (Peterson et al.). The exposed portions of the photosensitive layer remain hard, that is do not soften or melt, at the softening temperature for the unexposed portions. The absorbent material collects the softened un-irradiated material and then is separated/removed from the photosensitive layer. The cycle of heating and contacting the photosensitive layer may need to be repeated several times in order to sufficiently remove the flowable composition from the un-irradiated areas and form a relief structure suitable for printing. After such processing, there remains a raised relief structure of irradiated, hardened composition that represents the irradiated image.

Processors for thermal development of flexographic printing elements are known. U.S. Pat. No. 5,279,697 describes an automated process and apparatuses for handling an irradiated printing element and accomplishing heating and pressing to remove the unirradiated composition from the element. One embodiment of the thermal development apparatus shown in FIGS. 15 and 16 includes a heated plate that is brought into intimate contact with an absorbent material which in turn is in contact with an upper surface of a flexible sheet that resides on a base. The heated plate remains in place for a sufficient time to liquefy a portion of polymer material in the sheet and allow the liquified polymer material to be absorbed onto the absorbent material. The heated plate is removed and the flexible sheet and the absorbent material advance together while rolls separate the absorbent material from the formed flexographic sheet.

U.S. Pat. No. 5,279,697 describes another embodiment of an automated process and apparatus for handling an irradiated printing element and accomplishing repeated heating and pressing to remove the unirradiated composition from the element. WO 2001/18604 also describes a method and apparatus for thermal processing a photosensitive element. In both thermal processing apparatuses the absorbent material is a continuous sheet of a web, typically a non-woven, which is passed over a hot roll. The hot roll is urged towards a drum carrying the photosensitive element pressing the web against the photosensitive element and forming a nip. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent web. As the drum and hot roll rotate in contact together, the web is pressed against the photosensitive element to absorb the liquefied unirradiated composition and is then separated from the element.

A problem sometimes arises in thermal development processors in which the rotating hot roller brings the absorbent material into contact with the photosensitive element. Existing thermal development processes do not always adequately clean out or remove the uncured photopolymer from the recessed areas. In order to achieve improved relief uniformity the pressure at the nip between the hot roll carrying the absorbent material and drum carrying the photosensitive element can be increased to impress the absorbent material into the recessed areas. Increased nip pressure compresses the element creating a wider contacting zone for the nip, i.e., footprint, on the element along an axial length of the drum as well as increases the residence (i.e., dwell) time for the transfer of heat to the element. However, increased residence time that raises temperatures at or above the glass transition temperature of the base support for the element, can result in distortion of the resulting printing form or plate. In addition the hot roll has a tendency to deflect or bow along its length, resulting in non-uniform application of pressure to the photosensitive element along axial length of the contact zone. Non-uniform application of pressure can contribute to the resulting relief structure of the printing form having non-uniform relief depth.

Relief printing forms having distortion/s in the support and/or the cured photopolymeric layer result in poor print performance. In multicolor printing, when one or more of the relief printing forms have distortion the printed image has poor registration. Even in single color printing, distortion in the relief printing form may print an image that is not an accurate reproduction of its original, so called image infidelity, by printing straight lines as curves for example. The relief printing form having distortion/s may also incompletely print the image due to intermittent contact of the inked surface of the printing form to the printed substrate.

In addition, the existing thermal development processors can be expensive and difficult to manufacture as well as maintain, due to the mechanical complexity of the rotating and moveable hot roller and the need to monitor temperature with sensors on the moving parts.

SUMMARY OF THE INVENTION

The present invention provides for an apparatus for forming a relief pattern from a photosensitive element having an exterior surface and containing a composition layer capable of being partially liquefied. The apparatus comprising means for heating the exterior surface to a temperature sufficient to cause a portion of the layer to liquefy; means for supporting a development medium to provide contact with the exterior surface adjacent the liquefied portion; and means for providing relative movement between the development medium and the means for supporting; wherein the means for supporting comprises a non-rotating surface opposite the liquefied portion.

In accordance with another aspect of this invention there is provided a method for forming a relief pattern from a photosensitive element having an exterior surface and containing a composition layer capable of being partially liquefied. The method comprising heating the exterior surface to a temperature sufficient to cause a portion of the layer to liquefy and supporting a development medium for contacting with the exterior surface adjacent the liquefied portion; wherein the supporting step comprises contacting a non-rotating surface opposite the liquefied portion, and providing relative movement between the development medium and the non-rotating surface.

BRIEF DESCRIPTION OF THE DRAWINGS

The invention can be more fully understood from the following detailed description thereof in connection with the accompanying drawing described as follows.

DESCRIPTION OF THE PREFERRED EMBODIMENT(S)

Figure 1:
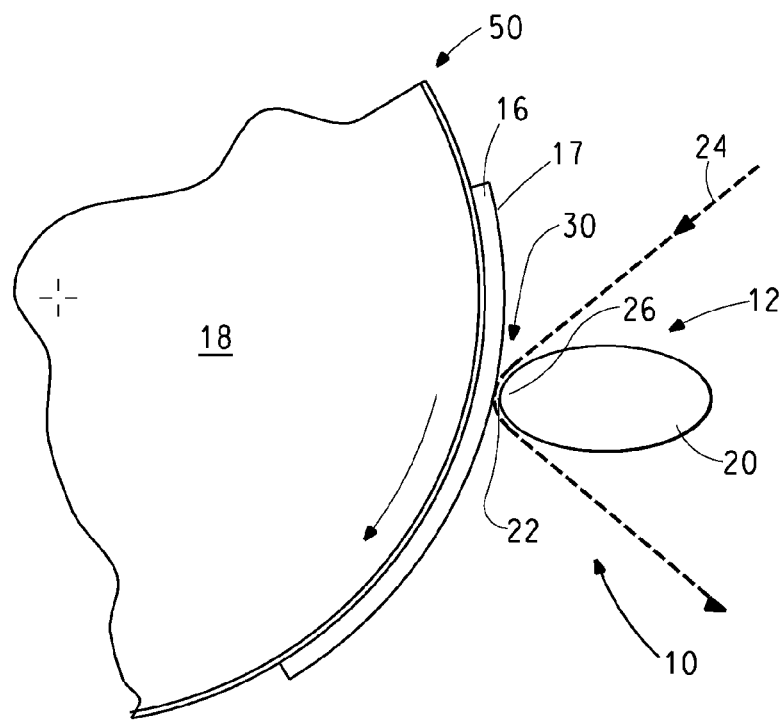
FIG. 1 is a schematic side view of a first embodiment of the present invention depicting a means for supporting a development medium to provide contact with a photosensitive element, wherein the means for supporting includes a non-rotating surface. The means for supporting has a cross-sectional shape that is non-circular.

Throughout the following detailed description, similar reference characters refer to similar elements in all figures of the drawings.

The present invention is an apparatus and process for thermally developing a photosensitive element, preferably to form a flexographic printing plate. The present invention contemplates an apparatus capable of heating a photosensitive element having a layer of composition capable of being partially liquefied to a temperature sufficient to melt or soften or liquefy at least a portion of the layer for any purpose. In particular, the present invention relates to an apparatus and process for supporting a development medium during thermal development.

Thermal development heats the photosensitive element to a development temperature that causes uncured portions of the composition layer to liquefy, i.e., melt or soften or flow, and be carried away by contact with the development medium. The development medium may also be referred to herein as development material, absorbent material, absorbent web, and web. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. No. 5,015,556; U.S. Pat. No. 5,175,072; U.S. Pat. No. 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

An apparatus suitable for thermally developing the photosensitive element is disclosed by U.S. Pat. No. 5,279,697, and also by Johnson et al. in U.S. Pat. No. 6,797,454 B1. The photosensitive element in all embodiments is in the form of a plate. The plate may be clamped onto a drum for thermal development in the round, or onto a flat base for thermal development in a press. However, it should be understood that one of ordinary skill in the art could modify each of the disclosed apparatuses to accommodate the mounting of the photosensitive element in any form suitable for flexographic printing. The photosensitive element can include the form of a cylinder, i.e., a sleeve, or a plate-on-sleeve or plate-on-carrier. The photosensitive element may be a continuous, seamless or substantially seamless photopolymerizable composition layer adjacent a cylindrically-shaped support. The cylindrically-shaped support may be referred to as a sleeve. Typically, plate-on-sleeve is a photosensitive element that includes at least the composition layer on a planar support, which is then mounted onto a cylindrically-shaped support. Typically, the plate-on-carrier is a photosensitive element that includes at least the composition layer on a planar support, which is then mounted onto a flexible sheet, known as a carrier sheet. Oftentimes, multiple photosensitive elements are mounted onto the carrier at various spaced locations.

In the present invention, thermal development includes heating of an exterior surface 17 of the composition layer of the photosensitive element 16 to a temperature Tr sufficient to cause a portion of the layer to liquefy. The thermal development process is conducted typically with more than one cycle of heating the element and contacting the element with the development medium in order to remove the uncured polymer to a suitable relief depth because uncured portions of the composition layer may only partially liquefy upon heating. The at least one photosensitive layer (and additional layer/s if present) can be heated by conduction, convection, radiation or other heating methods to a temperature sufficient to effect melting of the uncured portions but not so high as to effect distortion of the cured portions of the layer. One or more additional layers disposed above the composition layer may soften or melt or flow and be absorbed as well by a development medium. The development medium is a material absorbent to the uncured portions of the composition layer. The development medium could also be considered a blotting material wherein the uncured portions are removed by the development medium. The photosensitive element is heated to a surface temperature above about 40° C. (104° F.), preferably from about 40° C. to about 230° C. (104-446° F.) in order to effect melting or flowing of the uncured portions of the composition layer. The thermal treating steps of heating the photosensitive element 16 and contacting an outermost surface of the element with the development medium can be done at the same time, or in sequence provided that the uncured portions of the photopolymerizable layer are still soft or in a melt state when contacted with the development medium.

The present invention provides for a means for supporting the development medium with a support surface to provide contact of the development medium with the exterior surface of the photosensitive element. The means for supporting is disposed adjacent the exterior surface of the element, that is, adjacent the partially liquefied portion of the composition layer. The means for supporting includes a non-rotating surface that supports the development medium on a side of the development medium opposite the partially liquefied portion. The means for supporting includes a support member having the non-rotating surface on which the development medium resides or traverses. A side of the development medium opposite the partially liquefied portion contacts at least a portion of the non-rotating surface of the means for supporting.

The non-rotating surface of the means for supporting has advantages as it reduces the costs and simplifies the manufacture, operation, and maintenance of the apparatus as well as the method of using the apparatus. Also, the non-rotating surface allows for a much greater variety of shapes that can bring the development medium into contact with the element at a nip. This is advantageous in that the shape of the non-rotating surface can be selected to tailor the pressure distribution at the nip according to the needs of the system, i.e., element, apparatus, and method. The shape of the non-rotating surface could thus allow operation at lower total forces than are used in prior art apparatuses having a rotating roll. Additionally, the shape of the non-rotating surface can be selected to manage the transfer of heat at the nip (contact zone) independent of the pressure for contacting the development medium into the element. Thus, the printing form that results from thermal treatment with the non-rotating surface supporting the development medium typically has improved clean out or removal of the uncured photopolymer from the recesses areas of the relief structure and improved uniformity of relief depth, while avoiding excessive heat at temperatures that tend to distort the form.

The surface of the means for supporting is non-rotating, that is, the surface supporting the development medium has no or essentially no rate of motion relative to a fixed point in space during contact of the development medium to the photosensitive element. The non-rotating surface may be stationary or may move several degrees as a partial revolution during contact of the development medium to the photosensitive element. Preferably, the non-rotating surface supporting the development medium does not revolve about an axis or a center for more than one revolution.

The invention includes embodiments, in which the means for supporting has a circular cross-sectional shape, such as a roller for example, but the circular means for supporting does not rotate or revolve that is, the non-rotating surface is stationary. The invention also includes embodiments in which the means for supporting has a circular cross-sectional shape, and the support surface of the means for supporting moves several degrees. In this embodiment, the non-rotating support surface moves to some extent but not so much as to complete a revolution during a cycle of heating and contacting the development medium to the photosensitive element. The invention also includes embodiments in which the means for supporting has a non-circular cross-sectional shape, such as a wedge or ellipse for example, and provides an arcuate or projecting edge for the non-rotating surface. Hereto, the non-rotating surface may be stationary or may move a several degrees in a partial revolution. In embodiments where the means for supporting has a cross-sectional shape that is rectangular, it is preferred that the photosensitive element reside on a base member that has an arcuate outer surface, such as a drum or roller.

The means for supporting may move to position the non-rotating support surface adjacent to the exterior surface. A means for moving may move the means for supporting to position the non-rotating surface for thermal development, and/or may move the means for supporting to position the non-rotating surface into one or more orientations during development. For example, a means for moving may engage the support member to move the support member toward and away from the exterior surface of the element. The moving means may move the support member to deliver the development medium into contact with the exterior surface of the element for development and to retract from contact when relief structure is formed in the element. Also, the support member may move to position the non-rotating surface with the development medium to accommodate the thickness of different photosensitive elements. In addition, the means for supporting may be moved prior to or during contact of the development medium to the exterior surface to position the non-rotating surface (with the development medium) in order to accommodate clean-out of uncured photopolymerizable materials for various depths and types of relief areas. The means for moving may move the support member in an arc (about a fixed point) or in a line to accomplish desired orientation/s of the non-rotating surface for suitable removal of partially liquefied portions of the composition layer. It is also contemplated that the means for moving may move the means for supporting in an arc or in a line to one or more positions along or against the direction of travel of the exterior surface of the photosensitive element. The means for moving may also be used to control the depth that the support member, i.e., the non-rotating surface, penetrates into the exterior surface of the element.

The means for supporting may be coupled to one or more actuating devices, such as air cylinders, as the means for moving the support member. In one embodiment, each end of the support member is mounted onto arms attached to a beam that moves the support member under the urging of one or more air cylinders. It is well within the skill of those in the art to contemplate other embodiments for the means for moving the support member. Pressure cylinders used as the means for moving can also function as a means for pressing the support member with the development medium into the element. Alternatively the means for moving can function independent of the means for pressing. In another embodiment, the means for supporting is mounted to a frame or a subframe of the apparatus.

Preferably, the support member has a length at least as long as a transverse dimension of the photosensitive element on the base member, i.e., drum, and is aligned axially with the base member. It is also contemplated that the support member may have a length shorter than, and perhaps significantly shorter than, the transverse dimension of the element on the base member. The support member having a length shorter than the transverse dimension of the element may traverse the exterior surface of the photosensitive element as the base member rotates. That is, the support member would traverse in a spiral pattern on the photosensitive element. The support member has a cross-sectional shape that is not limited, and can include, for example, elliptical, arcuate including convex and concave surfaces, parabolic, circular, semi-circular, wedge, triangular, rectangular, and other polygonal shapes. The shape of the support member can be symmetrical or asymmetrical. The support member thus may have a cylindrical, a semi-cylindrical, or a non-cylindrical three-dimensional shape. The support member may be solid or may include a cavity (not shown) to accommodate sources of heating the support member or for circulating a heated fluid. The support member can also have the cavity to minimize its weight and/or to minimize its thermal mass so as to have more rapid response to temperature changes or to minimize heat losses in undesired locations.

The material/s of constructing the support member is not limited, and include, but are not limited to, sheet metal, cast metal, machined metal, alloys, polymer composite materials, thermoplastic materials, thermoset materials, and combinations thereof. The material chosen for the support member should be resistant to thermal distortion at the temperatures associated with thermal processing, and able to resist displacement, i.e., bending and torsion, under the operating forces in the process.

The non-rotating surface of the support member may optionally include a coating or may be otherwise modified to suit a desired purpose. Such as, for example, the non-rotating surface may be coated with a non-stick, low-friction material, such as a fluoropolymer, to improve transport of the development medium on the non-rotating surface. Another example is that the non-rotating surface may be coated with a resilient material, such as an elastomer having a Shore A hardness between about 30 and about 90, which may help to conform the support surface to the photosensitive element and the forming relief structure. The coating material can be applied in any manner suitable for use. The non-rotating surface may also be modified by treating the surface, such as plating or anodizing, on a metal support member, or by means known to those skilled in the art to provide a polished or roughened surface.

The invention further includes means for providing relative movement between the development medium and the means for supporting. In most embodiments, the photosensitive element and the development medium should move at the same or substantially the same linear speed to accomplish thermal development. To maintain this level of relative movement between the development medium and the exterior surface of the photosensitive element, there has to be a substantial relative movement between the means for supporting and the development medium. Relative movement may be provided by moving the development medium, or moving the means for supporting with the non-rotating surface, or moving both the development medium and the means for supporting. In one embodiment, the development medium is a continuous web that traverses the non-rotating surface of the means for supporting that is in a fixed position relative to the exterior surface of the element for thermal development. In another embodiment, the development medium is a continuous web that traverses the non-rotating surface of the means for supporting that is moved into one or more orientations by the means for moving during thermal development.

In an embodiment of the thermal processor 10 shown in FIG. 1, the means for supporting 12 is disposed adjacent the exterior surface 17 of the photosensitive element 16 that resides on a base member 18, i.e., drum. The means for supporting 12 includes a support member 20 having the non-rotating surface 22 that supports the development medium 24. The shape of the support member 20 is such that the non-rotating surface 22 includes a radius of curvature sufficiently small to form a projecting edge 26 about which the development medium 24 traverses. The support member 20 has an elliptical shape wherein a narrowed end of the ellipse is the non-rotating surface 22 that supports the development medium 24 in contact with the element 16. In this embodiment the projecting edge 26 or narrow end directs the development medium 24 into a recess or recesses of the relief forming areas along the width (transverse dimension) of the element 16 and thus provides improved clean out of the uncured photopolymerizable material from the element. The radius of curvature is sufficiently small to achieve increased localized pressure at a nip 30 between the element 16 and the development medium 24. Embodiments in which the non-rotating surface 22 includes a projecting edge 26 achieves a nip contact footprint (or contact zone) that is much less than the nip contact footprint formed by the rotating hot roll with a larger radius in the apparatuses of the prior art. The small nip contact zone associated with this embodiment typically allows for lower pressing forces to generate local unit contact pressures sufficient to drive the development medium into the relief-forming areas (compared to apparatuses of the prior art). The small contact zone at the nip 30 can also minimize the duration (or width) of compression of the photosensitive element 16, which may also help to control the transfer of heat from the support member 20 (at the non-rotating surface) to the element 16, and thus minimize distortion in the element due to excess heat.

Another advantage of a small contact zone formed by the non-rotating surface may be in reduction in the amount of vapor and/or condensate generated by the thermal development process. Photosensitive compositions may contain one or more components that can vaporize or volatilize when the element is heated to the temperature or temperatures necessary for thermal development to occur. The components that can vaporize or volatilize are generally low molecular weight compounds including monomer. The vapor can condense within a thermal development processor and drip uncontrolled onto different areas of the processor creating a mess within the processor. The small contact zone reduces the contact time of the heated surface with the development medium and the photosensitive element, and thus may create less vapor and/or condensate.

In embodiments where the support member 20 includes more than one projecting edges 26 which could be used as the non-rotating surface 22, such as in an ellipse or a wedge, it is contemplated that each projecting edge 26 have a radius of curvature that can be the same or different. The availability of different radius of curvature for a given support member 20 can provide greater adaptability of the processor to accommodate or improve clean-out of unpolymerized material from different relief structures being formed in photosensitive elements. In this case, the support member 20 may index to position the appropriate radius of curvature of the non-rotating surface 22 adjacent the exterior surface 17 of the photosensitive element 16, prior to thermal development of the element, or even between cycles of heating and contacting the element. It is preferred that the support member 20 would not index while contacting the photosensitive element 16.

Figure 2:
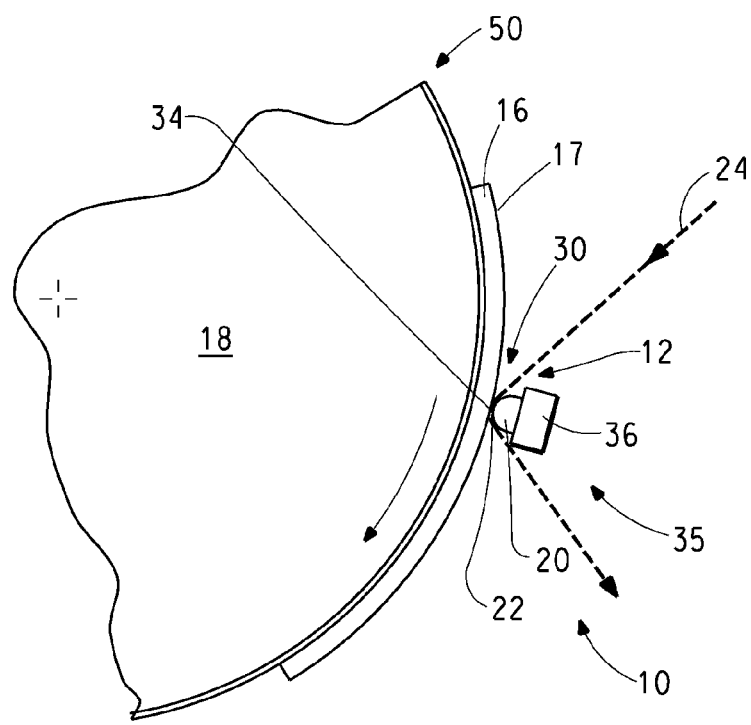
FIG. 2 is a schematic side view of a second embodiment of the present invention depicting the means for supporting the development medium to the photosensitive element, wherein the means for supporting includes a non-rotating surface. The means for supporting has a cross-sectional shape that is semi-circular.

In another embodiment of the apparatus 10 shown in FIG. 2, the shape of the support member 20 is semi-cylindrical having a cylindrical surface portion 34 that coincides with the non-rotating surface 22. The cylindrical, non-rotating, surface 22 has a radius of curvature of less than about 40 millimeters, which is less than a radius of curvature associated with the hot roller in the prior art devices. The radius of curvature of this embodiment can be as small as the radius of curvature depicted in FIG. 1. Similar to the embodiment of FIG. 1, this embodiment also achieves a nip contact footprint that is less than the nip contact footprint formed by the rotating hot roll in the apparatuses of the prior art. In prior art apparatuses, the rotating hot roll had relatively large diameter (i.e., large radius of curvature) in order to minimize deflection of the roll along its longitudinal axis. (Otherwise a complex anti-deflection structure would be needed to backup a smaller diameter rotating roll. Radial deflection of the roll is not desirable since it causes non-uniform pressures at the nip.) Also, the small nip contact zone associated with this embodiment allows for lower pressing forces sufficient to drive the development medium 24 into the relief-forming areas of the element 16 (compared to apparatuses of the prior art).

The support member 20 is adjacent a means for buttressing 35 that reinforces or strengthens the support member 20, particularly when the support member is in pressing contact with the photosensitive element 16. The means for buttressing 35 includes a buttress member 36. The means for buttressing 35 can optionally include a backup reinforcing structure, either of which can be made relatively massive to minimize or eliminate deflection that may occur with the support member 20. It is well within the skill of those in the art to determine suitable backup reinforcing structures to provide desired functionality. The buttress member 36 may be mounted to the frame or a subframe of the apparatus 10 and may be adapted with the means to move the support member 20, to thus move the buttress member with the support member. As shown in FIG. 2, the support member 20 is mounted onto the buttress member 36. Alternatively, the support member 20 may be integral with the buttress member 36. The presence of the non-rotating surface 22 in conjunction with the means for buttressing 35 allows for a smaller radius of curvature for the cylindrical surface portion 34 than would be possible with a rotating roll since this elegantly avoids or minimizes axial pressure non-uniformities due to deflection of the support member 20.

In embodiments where the support member 20 is mounted to a buttress member 36, it is contemplated that the non-rotating surface 22 of the support member or the support member 20 itself can be removable from the buttress member 36. By means well known to those skilled in the art, the non-rotating surface 22 or the support member 20 can be coupled onto the buttress member 36 such that the non-rotating surface 22 can be easily replaced for maintenance purposes, or in order to accommodate different processing conditions requiring different nip contact footprint or relief forming structures.

In embodiments where the non-rotating surface 22 includes the radius of curvature, the radius of curvature is less than 40 millimeters, preferably less than 35 millimeters, and most preferably 8 to 15 millimeters.

Figure 3:
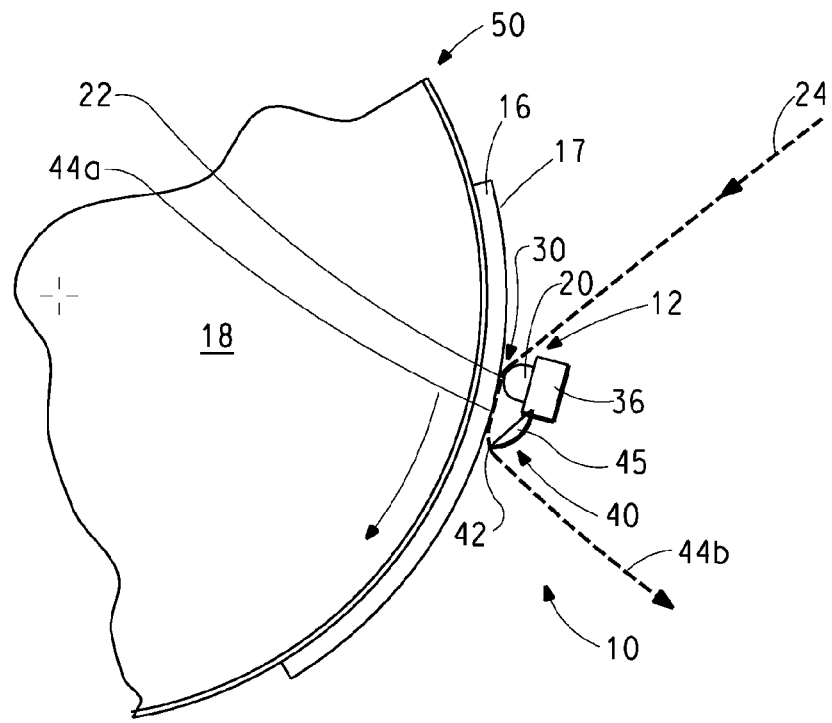
FIG. 3 is a schematic side view of a third embodiment of the present invention depicting a non-rotating surface for the means for supporting the development medium, and a means for removing the development medium from the photosensitive element.

The embodiment of the apparatus 10 shown in FIG. 3 is similar to the embodiment in FIG. 2 with the exception that a means for removing 40 the development medium 24 from the photosensitive element 16 is mounted to the means for buttressing 35. The means for removing 40 forms a peeling surface or edge 42 at which the development medium 24 can change direction from a first direction 44a where the development medium 24 travels in contact with the photosensitive element 16 to a second direction 44b where the development medium 24 is removed from the element 16 and ultimately returns to a take up (not shown). In the embodiment shown the means for removing 40 is a blade-like member 45. This embodiment and alternative means for removing 40 the development medium 24 from the photosensitive element 16 are described in co-filed patent application (U.S. application Ser. No. 11/191,807, now U.S. Pat. No. 7,503,258).

The means for supporting 12 the development medium 24 provides contact of the medium 24 with the exterior surface 17 of the photosensitive element 16 at the nip 30. In this embodiment, the development medium 24 remains in contact with the exterior surface 17 of the photosensitive element 16 beyond the nip 30 until reaching the means for removing 40. The development medium 24 and the photosensitive element 16 can remain in contact after the nip 30 for any distance to reach the means for removing 40. It is desirable to have the point where the development medium 24 is removed from the element 16 close to the nip 30 to minimize the effects of the molten polymer cooling while in contact with the development medium. If the molten polymer cools too much while in contact with the development medium 24 it may be difficult to separate the development medium from the element 16 and in some cases the medium may even tear. However, locating the means for removing 40 to be close to the nip 30 is limited by the structure of means for supporting 12 and/or the means for removing 40 structure that can fit in the space after the nip 30 and materials that can resist bending and torsion. In one embodiment the distance from an exit of the nip 30 to the means for removing 40 where the development medium 24 is peeled from the element 16 is generally greater than 0.5 inch (1.27 cm). In another embodiment the distance from the nip 30 to the means for removing 40 where the development medium 24 is peeled from the element 16 is 2 to 4 inch (5.1 to 10.2 cm), and preferably about 3 inch (7.6 cm). The means for removing 40 is located adjacent to the means for supporting 12 and adjacent the exterior surface 17 of the photosensitive element 16. The means for removing 40 can be part of but located away, or separate from, the means for supporting 12. The removing means 40 peels or removes the development medium 24 from the element 16 along an entire or substantially entire transverse dimension (i.e., width) of the element.

The means for removing 40 establishes a consistent location adjacent the exterior surface 17 of the photosensitive element 16 at which the development medium 24 separates from the element. The means for removing 40 can aid in keeping the photosensitive element 16 held to an outer surface of the base member 18 (drum) during web separation, eliminating or at least reducing lifting and sagging experienced by photosensitive elements in thermal processors of the prior art. While so doing the strains induced by the separating web on the photosensitive element 16 while still hot are minimized or substantially eliminated.

The means for removing 40 can be any shape, provided that the shape includes a peeling surface or edge 42 at which the development medium 24 can change direction from the first direction 44a where the medium travels in contact with the photosensitive element 16 to the second direction 44b where the medium ultimately returns to take up. Examples of shapes for the means for removing 40 include, but are not limited to, a blade, a roller, a roller backed by one or more support rollers, an elliptical-shaped member, a wedge and combinations thereof. The means for removing 40 can be formed from any material suitable for use including, but not limited to, sheet metal, cast metal, machined metal, alloys, polymer composite materials, thermoplastic materials, thermoset materials, and combinations thereof. The material chosen for the means for removing 40 should be resistant to thermal distortion at the temperatures associated with thermal processing, and able to resist displacement, i.e., bending and torsion, under the operating tension forces (of the web) in the process.

The removing means 40 can be mounted to the frame or subframe or to any member within the apparatus to in order accomplish its intended function. In the embodiment shown in FIG. 3, the blade-like member 45 of the removing means 40 is mounted to the buttress member 36. Alternatively, the removing means 40 can be mounted onto a bracket that is secured at each end in the frame of the processor 10. In one embodiment, the means for removing 40 is held in a fixed position relative to the outer surface of a base member 18 supporting the photosensitive element 16. In another embodiment, the means for removing 40 is held in a fixed position relative to the exterior surface 17 of the photosensitive element 16. Either of these previous embodiments may be particularly useful in thermal processors that develop photosensitive elements of one thickness or a narrow range of thickness. In another embodiment, the means for removing 40 (or the bracket) is mounted such that the means for removing can move rotationally about a pivot point as the development medium 24 is peeled from the photosensitive element 16. In this embodiment the removing means 40 can automatically adjust to photosensitive elements 16 of different thickness that may be developed in the thermal processor 10.

Figure 4:
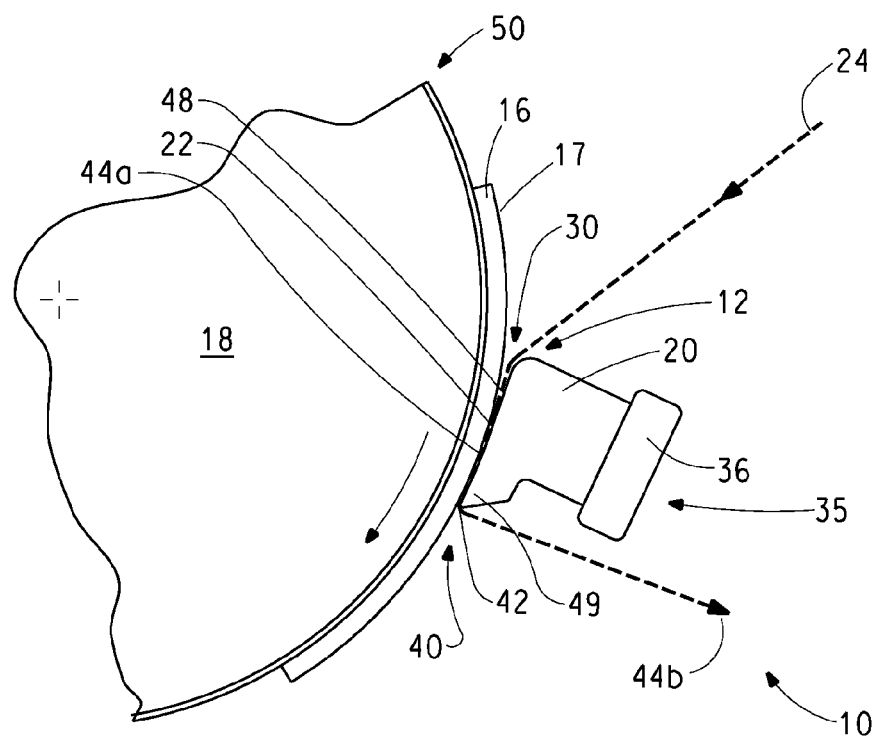
FIG. 4 is a schematic side view of a fourth embodiment of the present invention depicting the means for supporting a development medium wherein the means for supporting includes a non-rotating surface and a means for removing the development medium from the photosensitive element integral with the means for supporting.

In the embodiment of the apparatus 10 shown in FIG. 4, the cross-sectional shape of the support member 20 is substantially rectangular and has as the non-rotating surface 22 a flat or substantially planar surface 48 supporting the development medium 24. The support member 20 is mounted to the buttress member 36, but can be integral with the buttress member 36. It is also contemplated that the non-rotating surface 22 of the rectangular support member 20 can be a concave surface which conforms or substantially conforms to a portion of the exterior surface of the photosensitive element 16 while in position on the base member 18. The advantage mentioned above for small radius of curvature represented by the embodiments of FIGS. 1 and 2 withstanding, this embodiment of the non-rotating surface 22 provides a larger contact nip zone (than in FIGS. 1 and 2) which can increase heat transfer from the non-rotating surface 22 to the element 16 and so may allow the non-rotating surface 22 to be heated to a lower operating temperature.

In this embodiment, the means for removing 40 the development medium 24 from the element 16 is included with, but located away from, the means for supporting 12 the development medium 24. That is the means for supporting 12 and the means for removing 40 are a single (monolithic) structure, unlike the embodiment of FIG. 3 where the means for supporting 12 and the means for removing 40 are separate structures. The means for removing 40 is an extended member 49 of a surface of the support member 20 forming a peeling surface or edge 42 at which the development medium 24 can change direction from the first direction 44a where the development medium 24 travels in contact with the element 16 to the second direction 44b where the medium is removed from the element. It should be understood that the single structure which has separated the function of the means for supporting 12 and the means for removing 40, can be composite where each means is affixed to the support member 20, or, as is shown in FIG. 4, can be an integral structure. The non-rotating surface 22 and the means for removing 40 are included on the support member 20, positioned adjacent the base member 18, i.e., drum. The support member 20 or the buttress member 36 can be mounted to provide relative movement between the base member 18 and the means for supporting 12.

In one embodiment the processor 10 includes a means for heating (not shown) the non-rotating surface 22. The non-rotating surface 22 when heated can maintain or further elevate the temperature of the exterior surface 17 of the composition layer to temperature T2. The means for heating the non-rotating surface 22 is not limited and can be by any method, including an electrical core heater, steam, oil, hot air, and other heating sources that can provide a temperature of the non-rotating surface 22 sufficient to melt a portion of the composition layer through the development medium 24. The support member 20 carrying the development medium 24 on the non-rotating surface 22 applies heat to the exterior surface 17 of the element 16 upon contact, raising the temperature of the element and causing the uncured portions of the composition layer of the element to melt, soften, or flow into the development medium. The means for heating can be incorporated into one or more locations including, at the non-rotating surface 22, in the support member 20, in the cavity of the support member 20, in the buttress member 36, and/or in a cavity in the buttress member 36. The means for heating provides heat to at least the non-rotating surface in order to supply some or all of the heat necessary to increase the temperature of the exterior surface 17 of the element 16 to a temperature Tr sufficient to cause a portion of the layer to liquefy. It may also be desirable to heat the entire support member 20, some portion of the support member 20 and/or buttress member 36. Also, in embodiments where the support member 20 is mounted to a buttress member 36, the support member may be thermally isolated from a buttress member by means of insulation. Alternatively, the support member 20 may be thermally coupled to some or all of the mass of the buttress member 36 to increase the thermal mass of the means for heating.

The apparatus further includes a means for supporting 50 the photosensitive element 16. The means for supporting 50 the photosensitive element 16 is not limited, and can include for example a drum, multiple rolls, and a planar support. In the embodiments shown the means for supporting 50 the photosensitive element 16 is a drum acting as a base member 18, which has an outer surface for supporting the element. The drum 18 is mounted for rotation on the frame of the processor 10 and rotates in a clockwise direction. The outer surface of the base member 18 may include one or more layers to provide additional functionality to the outer surface, such as resiliency, tackiness, protection, etc. A resilient outer surface on the base member 18 can result in a longer nip zone and can accommodate some minor misalignment between the drum and the support member 20 for the development medium 24.

The base member 18 may be equipped with a heater, which is provided to keep the photosensitive element 16 at a stable starting temperature independent of the surrounding environment. Any means of heating the base member 18 is acceptable, as long as the power capacity of the heater is sufficient to maintain a fairly constant selected skin temperature on the outer surface of the drum of about 50-150° F. (10-65.6° C.), preferably 70 to 95° F. (21.1-35° C.). The means for heating the drum 18 is capable of heating the drum to a temperature capable of heating the exterior surface 17 of the composition layer to a temperature T3. The heater may be an electrical heating blanket, such as a wire wound blanket. If the normal operating environment is carefully controlled to be at a constant temperature, the heater can be turned off or omitted from the apparatus. As is disclosed in WO 2001/18604, it is also possible that the drum be cooled by cooling means, such as, a blower directing a stream of air at the surface of the photosensitive element and the drum and/or by the circulating of cooling fluid beneath the surface of the drum to cool the support side of the element.

The processor 10 may include another heating means (not shown) located adjacent the base member 18. This heating means can be a focused radiant heater directed at an exterior surface 17 of the photosensitive element 16 on the base member 18. The heater applies heat to the exterior surface 17 of the composition layer, elevating the temperature of the exterior surface 17 of the composition layer to a temperature T1. In one embodiment, the heater elevates the temperature of the surface 17 of the composition layer to a temperature Tr sufficient to melt the unirradiated portion of the composition layer, causing a portion of the layer to liquefy. In another embodiment, the radiant heater provides a portion of the heat necessary to raise the temperature of the surface 17 to a temperature Tr sufficient to melt the unirradiated portion, causing a portion of the layer to liquefy. The heater can include a one or a plurality of tubular infrared heating bulb/s mounted in end supports that also provide electrical connections to the bulb/s. The heater can also include a reflector adjacent to the bulb/s that acts to focus and direct the infrared radiation toward the exterior surface 17 of the element 16.

Temperature sensors may be mounted throughout the processor 10 to monitor the temperature for the purpose of controlling the heating elements in the base member 18, the means for supporting 12 the development medium 24, and the optional radiant heater.

The radiant heater acting as a first heating means, the means for heating the means for supporting the development medium, and the base member heater acting as a third heating means, independently or in any combination, are capable of heating the exterior surface 17 of the photosensitive element 16 to a temperature sufficient to cause a portion, i.e., an unirradiated portion, of the composition layer to liquefy at Tr. The first heating means, the second heating means, and the third heating means independently or in any combination constitute a heating station. A preferred heating station includes the first heating means and the second heating means.

The apparatus 10 includes the means for supporting the development medium 24 to the exterior surface 17 of the photosensitive element 16 to form the nip 30 between the non-rotating surface 22 and the base member 18. In one embodiment the development medium 24 is a continuous web that is unwound from a supply roll (not shown), traverses the non-rotating surface 22 at the nip 30 and the optional means for removing 40, and then wound up on a take up roll (not shown). The web may pass over one or more additional rolls from the supply roll to the support means 12, and may pass over one or more additional rolls from the support means to the take up roll. The support member 20, supply roll, take-up roll, and the one or more additional rolls can be mounted for rotation on the frame of the processor 10 or on a carriage that is movable so that it can be rolled out of the frame of the processor when required for servicing. One or more of the additional rolls may guide, idle, and/or drive the web through the processor 10.

The web of the development medium 24 may be under tension control, velocity control, or a combination thereof for transport through the processor 10. In one embodiment, especially suited for use with the means for removing 40, the processor 10 includes means for applying tension (not shown) to the development medium 24. The means for applying tension is located away from the exterior surface 17 of the element 16, and downstream of the means for removing 40. The web in its path from the removing means 40 to the take-up roll transports about a drive roll having an abrasive outer surface to prevent slippage of the web. A torque motor provides constant torque to the drive roll so as to apply a constant or substantially constant tension to the development medium web, at least during removal of the web from the element 16. The web contacts the abrasive outer surface of the drive roll and can loop over one or more idler rolls to aid in providing a substantially uniform tension to the web after the nip. The tension required to remove the web from the element 16 may change within a cycle, or from one cycle to a next cycle, during thermal development for a given photosensitive element. As such, a controller (not shown) for the torque motor can adjust the torque so that the tension in the web is accordingly changed. Other embodiments implementing constant or substantially constant tension of the web after the means for removing 40, can be contemplated by those skilled in the art. A suitable range of the tension in the web 24 for the tensioning means is from about 0.3 to 2 lbs/in (0.5 to 3.5 Newtons/cm) in one embodiment, and in another embodiment 0.5 to 1.0 lbs/in (0.875 to 1.75 Newtons/cm). In an alternate embodiment, the processor may include a motor to pull the web through the processor 10 at a linear speed that is synchronized with a linear speed of the outer surfaces of the sheet 16 on the drum.

The present invention may also include a means for providing relative motion between the base member 18 and the non-rotating surface 22 of the means for supporting 12, so that the element 16 and the development medium 24 can be brought into contact with the other. The means for providing relative motion can include the means for moving the support member 20 for the development medium 24 as described above. Means for providing relative movement can also be accomplished, for example, by mounting the means for supporting 50 the photosensitive element 16 onto a bracket that is supported on the frame and actuating the bracket to move the base member 18 toward the development medium. The means for providing relative motion bring the means for supporting 12 the development medium 24 and the means for supporting 50 the element 16 towards each other, the nip 30 is formed between the element 16 and the support member 20 with the development medium 24 between the element 16 and the non-rotating surface 22. The nip 30 is the location where the non-rotating surface 22 is in an engaged position against the base member 18. The non-rotating surface 22 carrying the development medium 24 is engaged against the element 16 in pressure contact. Providing such means for relative motion is described in U.S. Pat. No. 5,279,697 (Peterson et al.) and U.S. Pat. No. 6,797,454 B1 (Johnson et al.).

It is desirable to apply a uniform or substantially uniform pressure at the nip 30 across the width of the element 16 during processing. This uniform pressure assumes that the image across the nip 20 is uniform; those skilled in the art will recognize that the pressure applied will vary locally as image elements pass through the nip. Pressure is applied to force the absorbent web 24 into intimate contact with the photosensitive element 16. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the element surface to the absorbent web without distorting the composite photosensitive element.

The operation of the process for thermally developing the photosensitive element 16 begins with placing the element on to the drum 18. The drum heater or the radiant heater may be used to preheat the drum 18. A heater (not shown) for the means for supporting 12 the development medium 24 preheats the non-rotating surface 22 of the support member 20. The drum 18 starts turning and carries the element 16 with it. The radiant heater may preheat the bulbs before the element 16 reaches the heater, and then switch to an operating setting to achieve the desired temperature for melting the composition layer on element 16. As a leading edge of the element 16 reaches the position where the web of the development medium 24 being carried by the non-rotating surface 22 will contact the drum 18, the supporting means 12 moves to bring the web 24 against the element 16. The photosensitive element 16 composition layer is heated to between 40 and 230° C. (104-392° F.) while in contact with the development medium 24. The development medium 24 contacts the exterior surface 17 of the composition layer of the heated photosensitive element 16, and absorbs the liquefied portions of the elastomeric polymer from the unirradiated portions of the composition layer, forming a flexographic printing form in which portions are removed to form a relief pattern or surface. By maintaining more or less intimate contact of the development medium 24 with the composition layer that is molten in the uncured regions, a transfer of the uncured photosensitive material from the photopolymerizable layer, i.e., partially liquefied portions, to the development medium takes place. Intimate contact of the development medium 24 to the photopolymerizable layer may be maintained by the pressing the layer and the development medium together. The development medium 24 may be removed immediately after traversing the nip 30 area. Optionally while still in the heated condition and at a location away from where the web 24 contacted the element 16, the development medium 24 traverses a peeling edge 42 that causes the web to change direction 44*a* from traveling with the element to a substantially opposite direction 44*b*, thereby removing the development medium 24 from the exterior surface 17 of the element 16 to reveal the relief structure. As a trailing edge of the element 16 passes the nip 30, the radiant heater may cool down or turn off, the supporting means 12 can retract away from the nip 30 and the web may be stopped. The support member 18 may return the leading edge of the element 16 to the start position to begin another cycle of heating the element, contacting the web to the element, and removing the web from the element. A cycle of the steps of heating the photopolymerizable layer, contacting the molten (portions) layer with the development medium, and removing the development medium can be repeated as many times as necessary to adequately remove the uncured material from the composition layer and create sufficient relief depth. However, it is desirable to minimize the number of cycles for suitable system performance, and typically the photopolymerizable element is thermally treated for 5 to 15 cycles.

The method and apparatus of the present invention uses a non-rotating surface to support the development medium to reduce and/or eliminate the occurrence of distortions or waves in the resulting relief printing element. Another advantage is that the non-rotating surface provides improved relief uniformity for the resulting element. Also the manufacture and maintenance of thermal development processors according to the present invention is simplified and reduced cost.

Photosensitive Element

The present invention is not limited to the type of element that is thermally processed. In one embodiment, the photosensitive element 16 includes a flexible substrate and a composition layer mounted on the substrate. The composition layer is at least one layer on the substrate capable of being partially liquefied. Preferably, the photosensitive element 16 is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature Tr sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with an absorbent material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Infrared-sensitive layers and actinic radiation opaque layers are well known in the art. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of ≥2.5). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; and EP 0 741 330 A1. The infrared-sensitive layer preferably is removable by contact with an absorbent material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester.

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element 16 is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

The development medium is selected to have a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. It is also desirable that fibers are bonded in an absorbent material so that the fibers are not deposited into the plate during development. A non-woven material in web form is preferred.

After thermal development, the flexographic printing form may be post exposed and/or chemically or physically aftertreated in any sequence to detackify the surface of the flexographic printing form.

What is claimed is:

1. An apparatus for forming a relief pattern from a photosensitive element having an exterior surface and containing a composition layer capable of being partially liquefied comprising:
   means for heating the exterior surface to a temperature sufficient to cause a portion of the layer to partially liquefy;
   means for supporting a development medium to provide contact with the exterior surface adjacent the partially liquefied portion; and
   means for providing relative movement between the development medium and the means for supporting to cause the development medium to traverse the means for supporting;
   wherein the means for supporting comprises a non-rotating surface that contacts a side of the development medium opposite the partially liquefied portion, and wherein the non-rotating surface is resistant to displacement under operating forces encountered during formation of the relief pattern, and
   wherein the means for supporting further comprises means for pressing the photosensitive element and the development medium into contact at a pressure sufficient for at least a portion of the liquefied material of the composition layer to be absorbed and removed in depth by the development medium, to form the relief pattern on the element.

2. The apparatus of claim 1 wherein the means for supporting comprises a non-cylindrical support member.

3. The apparatus of claim 1 wherein the means for supporting further comprises a support member having a cross-sectional shape selected from the group consisting of elliptical, arcuate, parabolic, circular, semi-circular, wedge, triangular, rectangular, and polygonal shapes.

4. The apparatus of claim 1 wherein the means for supporting further comprises a support member having a means for providing heat to the support member.

5. The apparatus of claim 1 wherein the non-rotating surface is selected from the group consisting of planar surfaces and arcuate surfaces.

6. The apparatus of claim 5 wherein the non-rotating surface is arcuate, and selected from the group consisting of convex surfaces and concave surfaces, wherein the concave surfaces conform to a portion of the exterior surface.

7. The apparatus of claim 1 wherein the non-rotating surface comprises a radius of curvature less than 40 millimeters.

8. The apparatus of claim 1 wherein the non-rotating surface comprises a radius of curvature between 8 and 15 millimeters.

9. The apparatus of claim 1 wherein the non-rotating surface comprises a projecting edge about which the development medium traverses.

10. The apparatus of claim 1 wherein the means for supporting comprises more than one non-rotating surface each having a radius of curvature, wherein each radius of curvature can be the same or different.

11. The apparatus of claim 1 wherein the means for supporting 5 comprises a support member having more than one non-rotating surface, the apparatus further comprising means for indexing the support member to position each of the more than one non-rotating surface adjacent the exterior surface.

12. The apparatus of claim 1 wherein the means for supporting comprises a support member having a semi-circular cross-sectional shape and having a cylindrical surface portion coinciding with the non-rotating surface.

13. The apparatus of claim 12 wherein the means for supporting further comprises means for buttressing the support member.

14. The apparatus of claim 12 wherein the cylindrical surface portion has a radius of curvature less than 40 millimeters.

15. The apparatus of claim 1 wherein the means for supporting comprises a support member having a circular cross-sectional shape and having a cylindrical surface portion coinciding with the non-rotating surface.

16. The apparatus of claim 1 further comprising means for buttressing the support means opposite the non-rotating surface.

17. The apparatus of claim 1 further comprising
    means for supporting the photosensitive element; and
    means for delivering the development medium to the exterior surface.

18. The apparatus of claim 1 further comprising means for moving the means for supporting.

19. The apparatus of claim 1 further comprising means for removing the development medium from the exterior surface.

20. The apparatus of claim 1 further comprising means for applying tension to the development medium.

21. The apparatus of claim 1 wherein the photosensitive element is a photopolymerizable printing element.

22. The apparatus of claim 1 wherein the means for heating is selected from the group consisting of a first heating means that applies heat to the exterior surface of the composition layer adjacent where the development medium contacts the layer, the first heating adapted to heat the exterior surface of the layer;

a second heating means to heat the means for supporting the development medium to a temperature capable of heating the exterior surface of the composition layer while the development medium is contacting the exterior surface of the layer;

a third heating means to heat the means for supporting the photosensitive element to a temperature capable of heating the exterior surface of the composition layer;

combination of the first heating means and the second heating means;

combination of the first heating means and the third heating means;

combination of the second heating means and the third heating means; and combination of the first heating means, the second heating means, and the third heating means, wherein the first heating means, the second heating means, and the third heating means, individually or in the above combinations, is capable of heating the exterior surface of the composition layer sufficiently to cause a portion of the layer to liquefy.

23. The apparatus of claim 1 wherein the non-rotating surface is stationary.

24. The apparatus of claim 1 wherein the non-rotating surface moves less than one revolution about an axis.

* * * * *